United States Patent
Otsuka et al.

(10) Patent No.: US 7,714,360 B2
(45) Date of Patent: May 11, 2010

(54) SURFACE-STABILIZED SEMICONDUCTOR DEVICE

(75) Inventors: Koji Otsuka, Niiza (JP); Osamu Machida, Niiza (JP); Hitoshi Murofushi, Niiza (JP)

(73) Assignee: Sanken Electric Co., Ltd. (JP)

( * ) Notice: Subject to any disclaimer, the term of this patent is extended or adjusted under 35 U.S.C. 154(b) by 0 days.

(21) Appl. No.: 11/961,620

(22) Filed: Dec. 20, 2007

(65) Prior Publication Data

US 2008/0121876 A1    May 29, 2008

Related U.S. Application Data

(63) Continuation of application No. PCT/JP2006/311214, filed on Jun. 5, 2006.

(30) Foreign Application Priority Data

Jul. 13, 2005   (JP)   ............... 2006-204966

(51) Int. Cl.
  *H01L 21/338*  (2006.01)
  *H01L 29/778*  (2006.01)
  *H01L 29/812*  (2006.01)

(52) U.S. Cl. .................. 257/194; 257/40; 257/629; 257/642; 257/192; 257/200; 257/201; 257/E51.005; 257/E29.246; 257/E21.403; 257/E21.407; 438/172

(58) Field of Classification Search ................ 257/40, 257/E51.005, 192, 200, 201, 642, 631, E21.403, 257/E51.01, E29.246, E21.407; 438/172
See application file for complete search history.

(56) References Cited

U.S. PATENT DOCUMENTS

| | | | | |
|---|---|---|---|---|
| 4,943,537 A | * | 7/1990 | Harrington, III | ............ 438/217 |
| 5,068,700 A | * | 11/1991 | Yamaguchi et al. | ......... 257/212 |
| 5,081,510 A | * | 1/1992 | Ohtsuka et al. | ............. 257/473 |
| 5,118,637 A | * | 6/1992 | Ishikawa | ..................... 438/172 |
| 5,981,986 A | * | 11/1999 | Tsuchiya | .................... 257/200 |
| 6,433,356 B1 | * | 8/2002 | Cahen et al. | ................... 257/40 |
| 7,352,017 B2 | * | 4/2008 | Nakagawa et al. | .......... 257/194 |
| 7,494,855 B2 | * | 2/2009 | Kikkawa | ..................... 438/172 |
| 2001/0023964 A1 | * | 9/2001 | Wu et al. | ..................... 257/368 |
| 2004/0058485 A1 | * | 3/2004 | Makiyama et al. | .......... 438/182 |
| 2005/0133818 A1 | * | 6/2005 | Johnson et al. | ............. 257/192 |
| 2006/0102929 A1 | * | 5/2006 | Okamoto et al. | ............ 257/189 |
| 2006/0220039 A1 | * | 10/2006 | Yokoyama et al. | ............ 257/85 |
| 2006/0226442 A1 | * | 10/2006 | Zhang et al. | ................. 257/192 |

FOREIGN PATENT DOCUMENTS

| | | |
|---|---|---|
| JP | 61102072 | 5/1986 |
| JP | 01295459 | 11/1989 |

(Continued)

*Primary Examiner*—Zandra Smith
*Assistant Examiner*—Jeremy J Joy
(74) *Attorney, Agent, or Firm*—Woodcock Washburn LLP

(57) ABSTRACT

A high electron mobility transistor is disclosed which has a main semiconductor region formed on a silicon substrate. The main semiconductor region is a lamination of a buffer layer on the substrate, an electron transit layer on the buffer layer, and an electron supply layer on the electron transit layer. A source, drain, and gate overlie the electron supply layer. Also formed on the electron supply layer is a surface-stabilizing organic semiconductor overlay which is of p conductivity type in contrast to the n type of the electron supply layer.

7 Claims, 7 Drawing Sheets

FOREIGN PATENT DOCUMENTS

| | | |
|---|---|---|
| JP | 04002167 | 1/1992 |
| JP | 2000277830 A * | 10/2000 |
| JP | 2004152958 | 5/2004 |
| JP | 2004200248 | 7/2004 |
| JP | 2004214471 | 7/2004 |

* cited by examiner

SURFACE-STABILIZED SEMICONDUCTOR DEVICE

CROSS REFERENCE TO RELATED APPLICATIONS

This is a continuation of Application PCT/JP2006/311214, filed Jun. 5, 2006, which claims priority to Japanese Patent Application No. 2005-204966 filed Jul. 13, 2005.

BACKGROUND OF THE INVENTION

This invention relates to semiconductor devices such as field-effect transistors (FETs), Schottky-barrier diodes (SBDs), and pn-junction diodes. More particularly, the invention deals with the surface stabilization of such semiconductor devices.

Crystalline semiconductor regions of semiconductor devices have unique interface states at their surfaces. The semiconductor surface will become electrically unstable, and current leakage will occur between the electrodes, if charge carriers (e.g., electrons) are captured there. Current leakage should be reduced to a minimum by any means. It is customary in the semiconductor industry to assess the voltage-withstanding capability of a semiconductor device in terms of current leakage. The more prone a semiconductor device is to current leakage, the lower will be the assessment of its voltage-withstanding capability.

Conventional approaches to surface stabilization of crystalline semiconductor regions, as far as the applicant is aware, are: (a) surface cleaning; (b) treatment of what are known as "dangling bonds," unsaturated (broken) interatomic bonds at the semiconductor surface, which disrupt the flow of electrons; and (c) surface passivation. All these conventional methods have their own strengths, but weaknesses do appear particularly when they are applied to nitride or like compound semiconductors because, unlike silicon semiconductors, compound semiconductors have many crystal defects and interface states.

Another problem that manifests itself in relation to the electrification of the semiconductor surface is the so-called current collapse which takes place in a high electron mobility transistor (HEMT). The HEMT by itself is of the familiar make comprising an electron transit layer of, say, undoped gallium nitride and an electron supply layer of, say, either n-type or undoped aluminum gallium nitride. Overlying the electron supply layer are source and drain electrodes with a Schottky gate electrode therebetween. The resistance of the electron supply layer is so low in its thickness direction, and so high in its transverse direction, that the current flows between the drain and source electrodes through the two-dimensional electron gas layer in the electron transit layer. The two-dimensional electron gas layer appears because of piezo and/or spontaneous depolarization of the heterojunction between electron transit layer and electron supply layer.

In use of the HEMT in alternating current circuitry, negative charge carriers (electrons) are arrested at the interface state of the surface of the electron supply layer, as described in Japanese Unexamined Patent Publication No. 2004-214471. The electron density of the two-dimensional electron gas layer lessens due to the arrested negative charge carriers, resulting in current collapse in which the maximum drain current during alternating current operation grows less than that during direct current operation. The lessening of the maximum drain current is ascribed to the decrease of electron density in the two-dimensional electron gas layer by reason of the collection of negative charge carriers in the interface state surface of the electron supply layer.

The unexamined Japanese patent application cited above proposes a silicon nitride overlay on the electron supply layer for prevention of current collapse. This solution proved unsatisfactory as it reduced the gate-drain voltage strength of the HEMT. Moreover, the silicon nitride overlay was not nearly so effective as might be desired for prevention of current collapse as it served only for reduction of the carriers captured by the interface state, not for annihilation of the captured carriers.

The same unexamined Japanese patent application also suggests a silicon dioxide overlay on the silicon nitride overlay, and a field control electrode on the silicon dioxide overlay, in order to enhance the voltage strength. A field plate, instead of the field control electrode, is provided on the silicon nitride overlay via the silicon dioxide overlay for the same purpose according to Japanese Unexamined Patent Publication No. 2004-200248. The field control electrode and field plate are both objectionable because they incur additional costs for the manufacture of the HEMTs.

SUMMARY OF THE INVENTION

It is among the objects of this invention to stabilize the surface of semiconductor devices of the kind defined, in a more economical, positive and reliable way than heretofore.

Another object of the invention is to achieve surface stabilization of semiconductor devices of the kind defined, in a manner capable of more positively precluding current collapse than heretofore.

Briefly, the present invention may be summarized as a surface-stabilized semiconductor device comprising a main semiconductor region of crystalline semiconductor material configured to provide a desired kind of semiconductor device, and a plurality of electrodes formed on a major surface of the main semiconductor region so as to leave part of the major surface exposed. Also included, and constituting a feature of the invention, is an organic semiconductor overlay at least partly covering that part of the major surface of the main semiconductor region which is left exposed by the electrodes. The organic semiconductor overlay is made from a material capable of counteracting electrification of the major surface of the main semiconductor region.

Thus, according to the invention, all that is required for surface stabilization of the semiconductor device is to fabricate the organic semiconductor overlay on the surface of the main semiconductor region. The organic semiconductor overlay is capable of fabrication by any such known methods as evaporation and sputtering.

Made from materials suggested by the invention, the organic semiconductor overlay is so low in carrier mobility that current leakage through this overlay, or through the interface between the overlay and the main semiconductor region, is negligible. The semiconductor device is therefore improved in voltage withstanding capability.

The organic semiconductor overlay offers, in its application to the HEMT, the advantage of current collapse prevention in addition to improved voltage strength through surface stabilization. The organic semiconductor overlay of either p or n conductivity type is capable of annihilating the negative or positive charge that has been arrested at the surface of the main semiconductor region of the HEMT and/or of preventing the charge from being arrested there. By so doing the organic semiconductor overlay positively saves the HEMT from current collapse, preventing a decrease in the density of the two-dimensional charge carriers (electrons or holes) in the two-dimensional carrier layer created in the main semiconductor region.

The above and other objects, features and advantages of this invention will become more apparent, and the invention itself will best be understood, from a study of the following description and appended claims, with reference had to the attached drawings showing some preferable embodiments of the invention.

DESCRIPTION OF THE PREFERRED EMBODIMENTS

Figure 1:
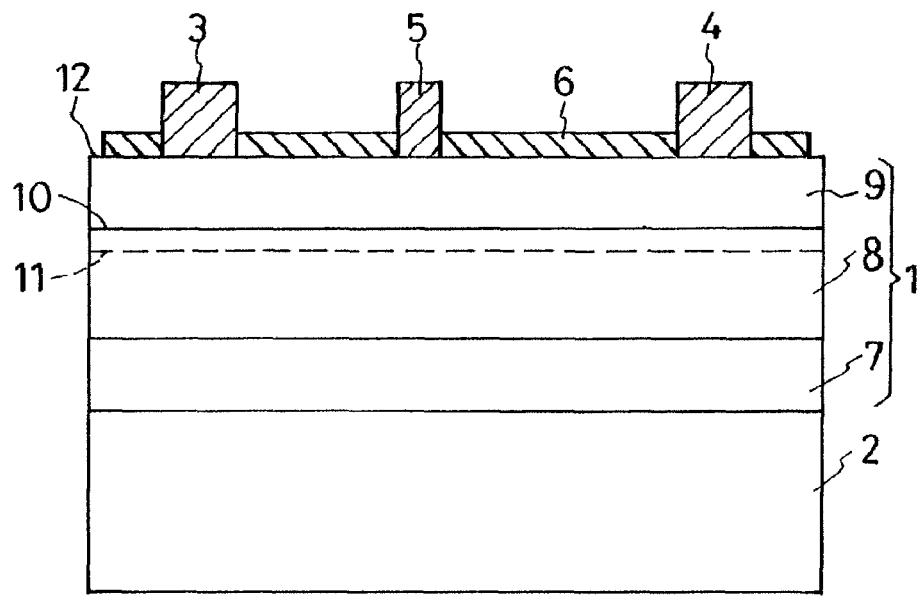
FIG. 1 is a schematic sectional illustration of a HEMT built on the novel principles of the invention.

The principles of the present invention are most advantageously applicable to HEMTs, a type of FET that takes advantage of high electron mobility realized in a two-dimensional carrier gas layer for current flow. The representative HEMT shown in FIG. 1 has a main semiconductor region 1 grown on a substrate 2. Formed on the major surface 12, facing away from the substrate 2, of this main semiconductor region 1 are a source 3, a drain 4, a gate 5, and an organic semiconductor overlay 6 constituting a feature of the invention.

The main semiconductor region 1 is here shown as a lamination of three constituent layers consisting of a buffer layer 7, electron transit layer or first semiconductor layer 8, and electron supply layer or second semiconductor layer 9, grown in that order on the substrate 2 of monocrystalline silicon semiconductor. These constituent layers of the main semiconductor region 1 may all be grown by such familiar methods as metalorganic chemical vapor deposition (MOCVD) also known as metalorganic vapor phase epitaxy (MOVPE), and organometallic vapor phase epitaxy (OMVPE). The topmost electron supply layer 9 provides the noted major surface 12 of the main semiconductor region 1.

The constituent layers 7-9 of the main semiconductor region 1 may be made from any such semiconducting crystals as those of gallium nitride (GaN), indium gallium nitride (InGaN), aluminum gallium nitride (AlGaN), aluminum indium gallium nitride (AlInGaN), aluminum nitride (AlN), indium aluminum nitride (InAlN), aluminum phosphide (AlP), gallium phosphide (GaP), aluminum indium phosphide (AlInP), gallium indium phosphide (GaInP), aluminum gallium phosphide (AlGaP), aluminum gallium arsenide (AlGaAs), gallium arsenide (GaAs), aluminum arsenide (AlAs), indium arsenide (InAs), indium phosphide (InP), indium nitride (InN), gallium arsenic phosphide (GaAsP), silicon (Si), silicon carbide (SiC), and carbon (C). Nitride semiconductors are particularly preferred for a higher voltage-withstanding capability of the HEMT. A more detailed explanation of these semiconductor layers 7-9 follows.

The buffer layer 7 may be either mono- or multi-layered. The multilayer option may comprise, for example, a desired number of alternations of an AlN sublayer and a GaN sublayer. Other semiconductor materials are adoptable. Being not too closely associated with the operation of the HEMT, however, the buffer layer 7 is eliminable.

Directly overlying the buffer layer 7 is the electron transit layer 8, sometimes referred to as a channel, which is made from undoped GaN in this particular embodiment. The electron transit layer 8 creates a heterojunction 10 between itself and the overlying electron supply layer 9, the latter being different in material. The heterojunction 10 gives rise to either or both of piezo and spontaneous depolarization. The electric field due to such depolarization creates the aforementioned two-dimensional electron gas layer in upper part of the electron transit layer 8, as indicated by the dashed line labeled 11.

Grown on the electron transit layer 8, the electron supply layer 9 is made from any of the nitride semiconductors of the following general composition plus an n-type dopant:

$$Al_xGa_{1-x}N$$

where the subscript x is a numeral that is greater than zero and less than one, preferably in the range of 0.2 through 0.4, and most desirably 0.3.

The electron supply layer 9 is so thin that that its electric resistance is negligibly small in its thickness direction compared to that in its transverse direction. As a whole, the component of the drain-source current or transverse current of the HEMT that flows through this electron supply layer 9 is negligible. The electron supply layer 9 might be made from undoped AlGaN, an n-like semiconductor.

The electron supply layer 9 of n-type AlGaN is less in lattice constant than the underlying electron transit layer 8 of GaN, resulting in the creation of piezo depolarization due to the heterojunction 10 between these neighboring layers 8 and 9. Spontaneous depolarization also results from the n-doped electron supply layer 9. The aforesaid two-dimensional electron gas layer 11 appears because of the field due to the piezo and spontaneous depolarizations. Containing electrons (carriers) that have a latitude of motion in a direction parallel to the major surface 12 of the main semiconductor region 1, the two-dimensional electron gas layer provides a current path between source 3 and drain 4.

The source 3 and drain 4 are both formed on the major surface 12 of the main semiconductor region 1 with a prescribed spacing therebetween. These electrodes 3 and 4 may both be made from laminations of titanium and aluminum, making low-resistance contact with the electron supply layer 9.

The gate or gate electrode 5 is interposed between source 3 and drain 4, with spacings from both, and made from rhodium, for example, for Schottky contact with the electron supply layer 9. A voltage applied to the gate 5 alters the conductivity of the two-dimensional electron gas layer 11. Let it be assumed that this HEMT is normally on, and that the drain 4 is higher in potential than the source 3. Then, when no voltage is impressed to the gate 5, carriers will flow along the path sequentially comprising the source 3, electron supply layer 9, two-dimensional electron gas layer 11, electron supply layer 9 again, and drain 4. However, upon application of a prescribed voltage to the gate 5, the two-dimensional electron gas layer 11 will either disappear or constrict at its part under the gate, with the result that the carrier flow is either interrupted or restricted. The HEMT may be normally off, and the drain 4 higher in potential than the source 3. Then, upon voltage application to the gate 5, carriers will flow along the path sequentially comprising the source 3, electron supply layer 9, two-dimensional electron gas layer 11, electron supply layer 9 again, and drain 4. The two-dimensional electron gas layer 11 will disappear under the gate 5 when no voltage is impressed to the gate 5, interrupting the carrier flow.

The organic semiconductor overlay 6 covers all, or nearly all, of the major surface 12 of the main semiconductor region 1 except where the electrodes 3-5 are formed, in this particular embodiment. This overlay 6 has a p-type conductivity, opposite to the n-type conductivity of the underlying electron supply layer 9, and is chemically different from the main semiconductor region 1 of inorganic or crystalline semiconductors. The overlay 6 can be made from any such materials as acenes (e.g., pentacene, tethracene, and anthracene), perylene, rubrene, phthalocyanine, and zinc phthalocyanine. Tethracene and zinc phthalocyanine are particularly recommended.

The organic semiconductor overlay 6 may be formed on the surface of the n-type AlGaN electron supply layer 9 by any such known methods as evaporation, sputtering, sol-gel, spin-on, and resistive heating deposition, the last two being preferred. The organic semiconductor overlay 6 is 50 nanometers thick in this embodiment. Also in this embodiment the organic semiconductor overlay 6 covers all the parts of the main semiconductor region surface 12 which lie between source 3 and gate 5 and between drain 4 and gate 5 and parts of the surface parts which lie outwardly of the source 3 and drain 4.

As was discussed in connection with the prior art, in the absence of the organic semiconductor overlay 6, the major surface 12 of the main semiconductor region 1 would be negatively charged when the drain 4 went negative in potential with respect to the source 3 as a result of the application of the negative half-cycles of an AC voltage to the HEMT. Electrons would then decrease in the two-dimensional electron gas layer 11, and so would the maximum drain current when the HEMT was on. In contrast, thanks to the p-type organic semiconductor overlay 6 according to the invention, the negative charge on the major surface 12 of the main semiconductor region 1 will be annihilated under the influence of the field due to that overlay. The annihilation or the reduction of the negative charge on the major surface 12 results from the cancellation or counteracting of the negative charge by the holes coming from the organic semiconductor overlay 6.

How the organic semiconductor overlay 6 precludes current collapse is explainable in a different perspective. The p-type organic semiconductor overlay 6, n-type AlGaN electron supply layer 9, and two-dimensional electron gas layer 11 may be thought of in combination as a capacitor. The electron supply layer 9 provides the dielectric of the imaginary capacitor, and the organic semiconductor overlay 6 and two-dimensional electron gas layer 11 the positive and negative electrodes, respectively, of the imaginary capacitor. As the positive charge on one surface of the electron supply layer 9 is captivated by the organic semiconductor overlay 6, the negative charge on the other surface of the electron supply layer 9 is stabilized. The result is a lessening of a decrease in electrons in the two-dimensional electron gas layer 11 due to current collapse.

It may be pointed out at this juncture that the diminution of the negative charge on the major surface 12 of the main semiconductor region 1 by the method of this invention utilizing the p-type organic semiconductor overlay 6 is in marked contrast to the reduction of electrification by the conventional method of semiconductor surface stabilization through elimination of the aforesaid dangling interatomic bonds. The dangling bonds are admittedly responsible for electrification. The conventional method is an indirect anti-electrification measure, being designed for reduction of electrification through treatment of the dangling bonds. The method of this invention is more positive as it utilizes the p-type organic semiconductor overlay 6 for directly eliminating the negative charge by providing the holes to be coupled to the electrons.

The p-type organic semiconductor overlay 6 assures a carrier (hole) mobility of 1.5 cm$^2$/V·s at a maximum, much less than the carrier (electron) mobility of the electron supply layer 9 of III-V compound semiconductors. Essentially, therefore, the organic semiconductor overlay 6 is an insulator, so that the current flowing through this overlay between drain 4 and gate 5 and between source 3 and gate 5 is negligibly small. It will thus be appreciated that the organic semiconductor overlay 6 serves not just for elimination of current collapse but for surface protection or stabilization of the main semiconductor region 1.

Figure 2:
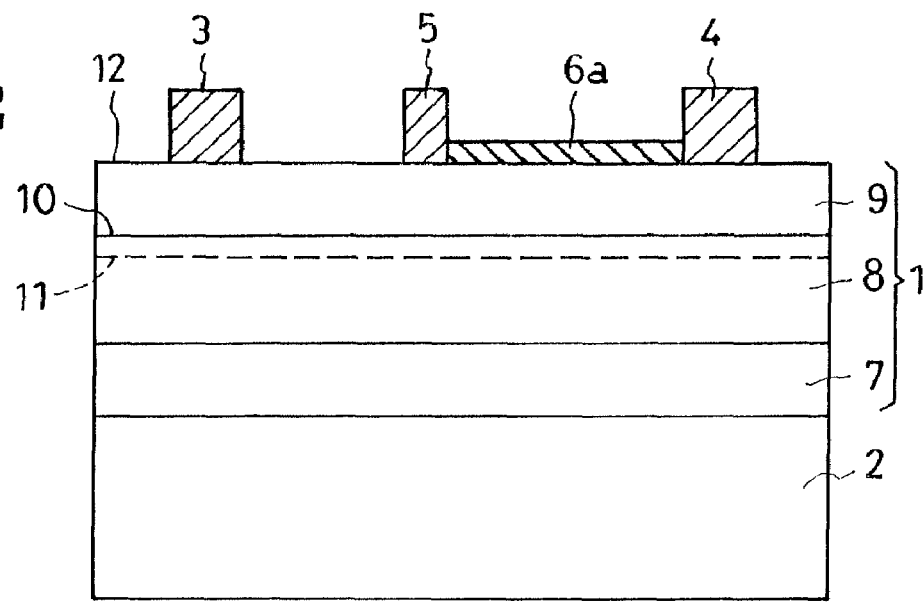
FIG. 2 is a view similar to FIG. 1 but showing another preferred form of HEMT embodying the invention.

Embodiment of FIG. 2

The HEMT seen here is of the same construction as that of FIG. 1 except for a p-type organic semiconductor overlay $6_a$ which covers all of that part of the major surface 12 of the main semiconductor region 1 which lies between drain 4 and gate 5. The limited coverage of the semiconductor surface 12 by the overlay $6_a$ is effective for restriction of the lessening of electrons, and consequent current collapse, in the underlying part of the two-dimensional electron gas layer 11.

Figure 3:
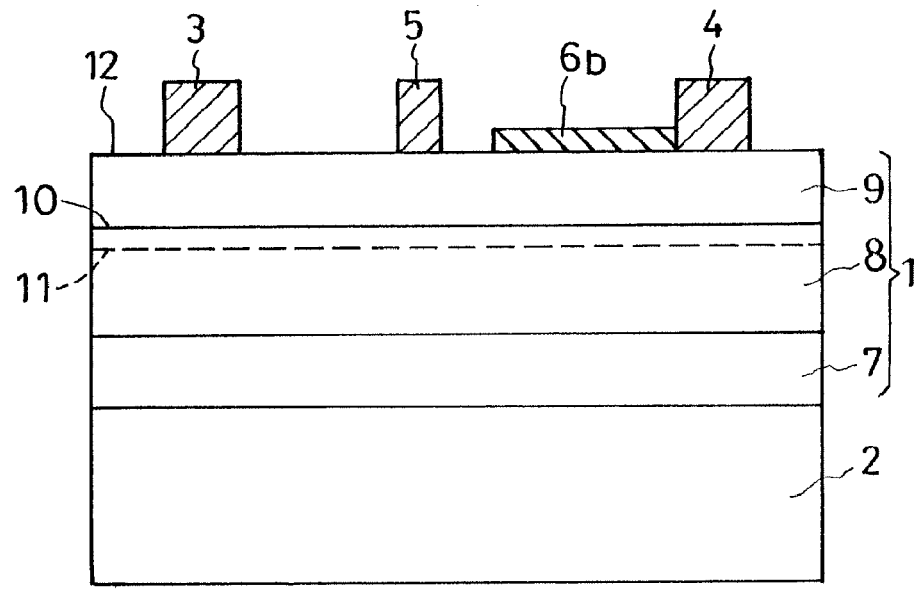
FIG. 3 is also a view similar to FIG. 1 but showing still another preferred form of HEMT embodying the invention.

Embodiment of FIG. 3

This embodiment differs from that of FIG. 2 only in an organic semiconductor overlay $6_b$ which covers only part of that part of the major surface 12 of the main semiconductor region 1 which lies between drain 4 and gate 5. A spacing exists between gate 5 and overlay $6_b$. This overlay $6_b$ is nearly as effective as its FIG. 2 counterpart $6_a$.

Figure 4:
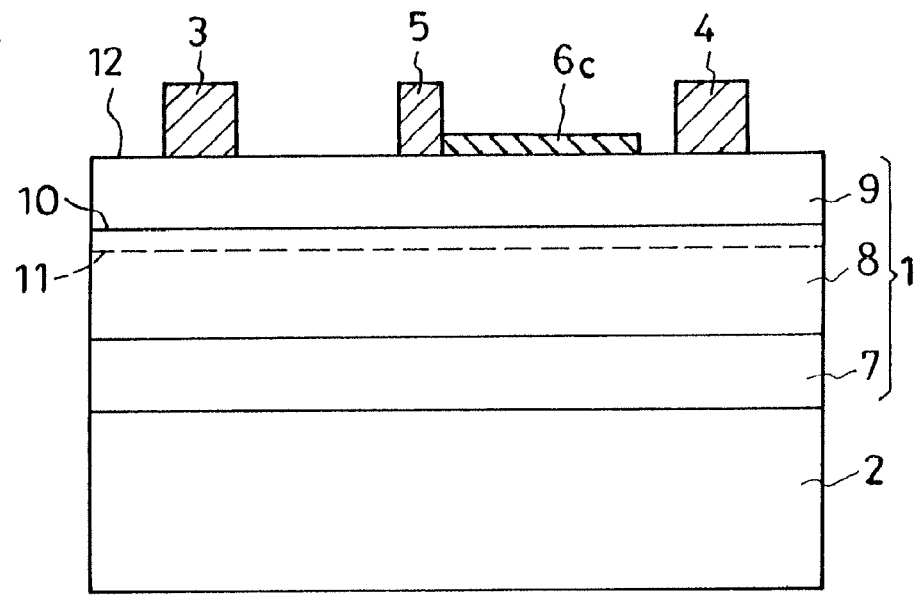
FIG. 4 is also a view similar to FIG. 1 but showing yet another preferred form of HEMT embodying the invention.

Embodiment of FIG. 4

The organic semiconductor overlay $6_c$ depicted here is similar in size and positioning to its FIG. 3 counterpart $6_b$, but a spacing exists between drain 4 and overlay $6_c$ instead of between gate 5 and overlay $6_c$. This overlay $6_c$ is also nearly as effective as its FIG. 2 counterpart $6_a$.

Figure 5:
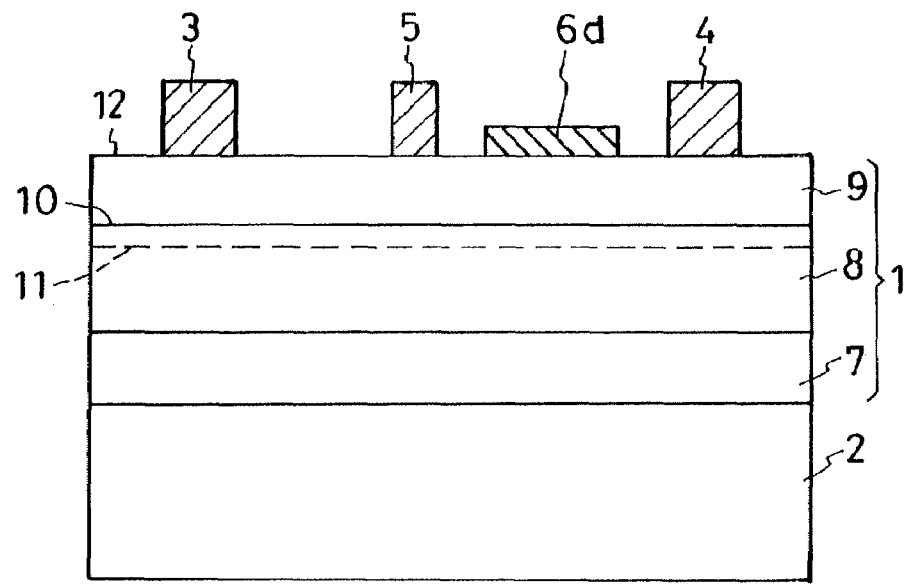
FIG. 5 is also a view similar to FIG. 1 but showing a further preferred form of HEMT embodying the invention.

Embodiment of FIG. 5

The organic semiconductor overlay $6_d$ is here placed between drain 4 and gate 5 but spaced from both of them. This overlay $6_d$ is also nearly as effective as its FIG. 2 counterpart $6_a$.

Figure 6:
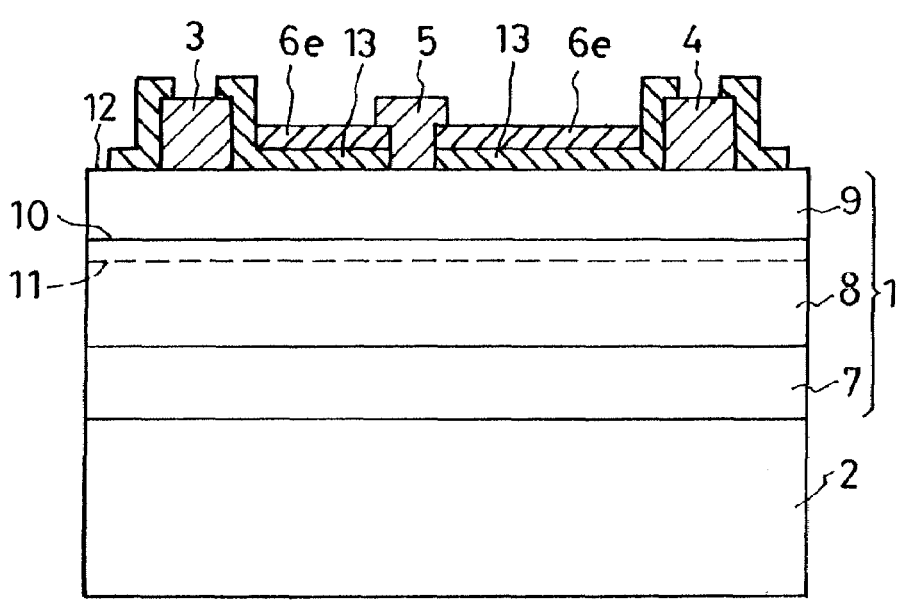
FIG. 6 is also a view similar to FIG. 1 but showing a further preferred form of HEMT embodying the invention.

Embodiment of FIG. 6

This embodiment differs from that of FIG. 1 in additionally incorporating a protective covering 13 of a solid insulator or dielectric, preferably silicon oxide ($SiO_2$), enveloping the major surface 12 of the main semiconductor region 1. The organic semiconductor overlay $6_e$ is held against the major surface 12 of the main semiconductor region 1 via the protective covering 13. Both electron supply layer 9 and protective covering 13 provide the dielectric of a capacitor, serving to prevent current collapse in a manner set forth previously in conjunction with the FIG. 1 embodiment.

Despite the showing of FIG. 6 the organic semiconductor overlay need not be provided both between source 3 and gate 5 and between drain 4 and gate 5. Such an overlay may instead be formed on the protective covering 13 in any of the positions suggested in FIGS. 2-5.

Figure 7:
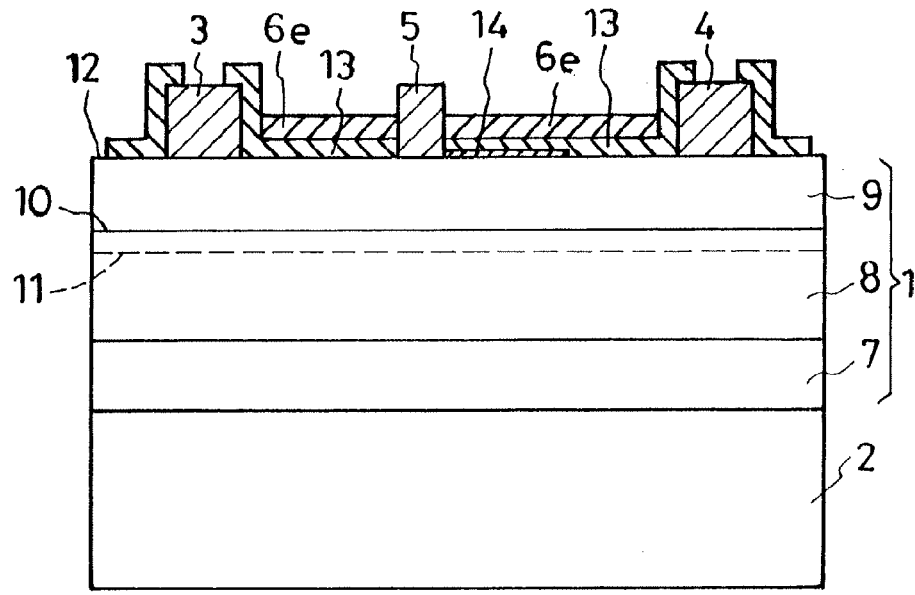
FIG. 7 is also a view similar to FIG. 1 but showing a further preferred form of HEMT embodying the invention.

Embodiment of FIG. 7

The HEMT shown here is similar in construction to that of FIG. 6 except for the addition of a resistive Schottky barrier field plate 14. The field plate 14 is shown interposed between main semiconductor region 1 and protective covering 13, covering part of that part of the major surface 12 of the main semiconductor region which lies between drain 4 and gate 5, with a spacing from the drain. Thus the field plate 14 is electrically coupled directly to the gate 4 and makes Schottky contact with the major surface 12 of the main semiconductor region 1. The organic semiconductor overlay $6_e$ is of the same placement as that of FIG. 6.

Itself conventional in the art, the field plate 14 may be from, for example, titanium oxide having a sheet resistance of 10 kilohms per square or more, as disclosed in Japanese Unexamined Patent Publication No. 1-295459. The field plate 14 functions to prevent field concentration between drain 4 and gate 5 thereby enabling the HEMT to withstand higher voltages. Current collapse is avoided as in all the foregoing embodiments. The organic semiconductor overlay could be formed on the protective covering 13 in any of the positions suggested in FIGS. 2-5.

Figure 8:
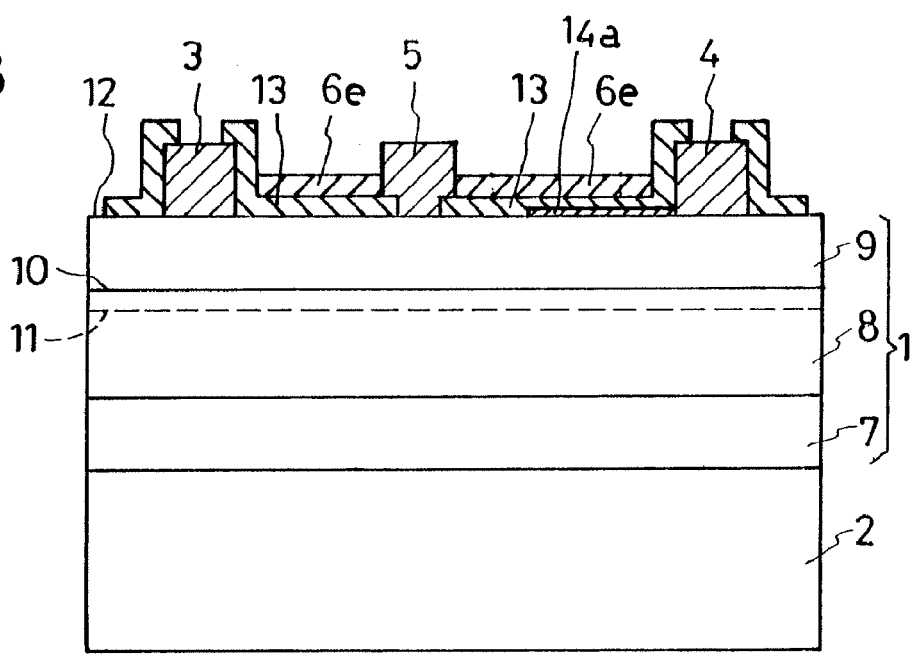
FIG. 8 is also a view similar to FIG. 1 but showing a further preferred form of HEMT embodying the invention.

Embodiment of FIG. 8

A different position is here suggested for a resistive Schottky barrier field plate $14_a$, all the other constructional details of this embodiment, including the organic semiconductor overlay $6_e$, being the same as those of the FIG. 7 embodiment. Placed in direct contact with the drain 4, the field plate $14_a$ extends toward, and terminates short of, the gate 5. The field plate $14_a$ of this placement is also conducive to the mitigation of field concentration between drain 4 and gate 5.

Figure 9:
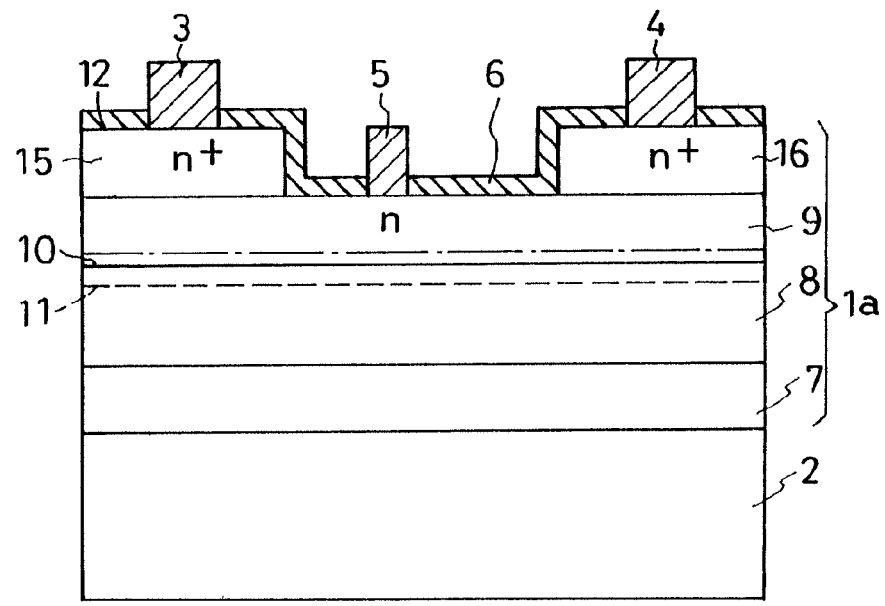
FIG. 9 is also a view similar to FIG. 1 but showing a further preferred form of HEMT embodying the invention.

Embodiment of FIG. 9

This embodiment features a modified main semiconductor region $1_a$ and is otherwise substantially analogous with the FIG. 1 HEMT. The modified main semiconductor region $1_a$ is identical with its FIG. 1 counterpart 1 except for an $n^+$-type source contact layer 15 and $n^+$-type drain contact layer 16 which are both formed on the n-type electron supply layer 9 and which are spaced from each other. The source 3 is formed on the source contact layer 15, and the drain 4 on the drain contact layer 16. The source contact layer 15 and drain contact layer 16 are both made with a nitride semiconductor such as AlGaN, with an n-type impurity concentration higher than that of the electron supply layer 9. The organic semiconductor overlay 6 covers both source contact layer 15 and drain contact layer 16 and the remaining exposed surface of the electron supply layer 9.

This embodiment offers the advantage of less contact resistance for source 3 and drain 4, in addition to all those listed in conjunction with the FIG. 1 embodiment. The source contact layer 15 and drain contact layer 16 could be incorporated in all the other HEMTs of FIGS. 2-8.

Figure 10:
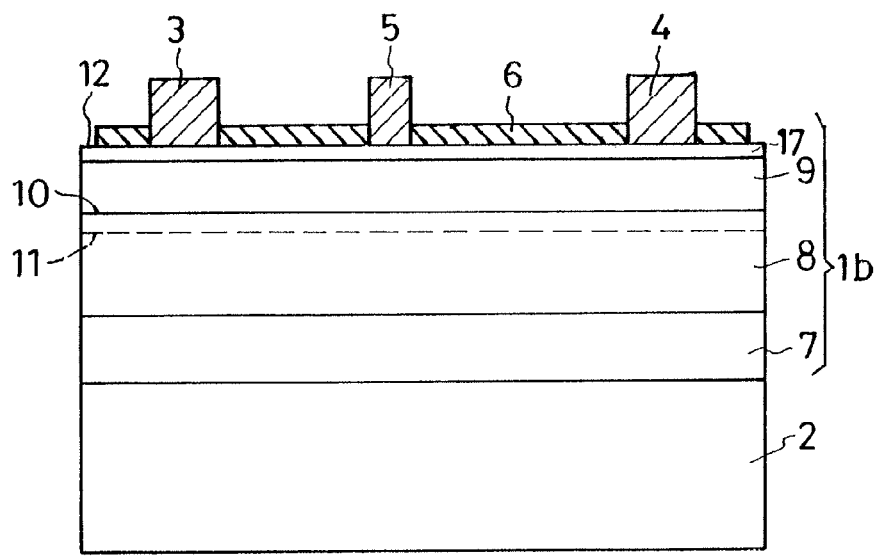
FIG. 10 is also a view similar to FIG. 1 but showing a further preferred form of HEMT embodying the invention.

Embodiment of FIG. 10

Another modified main semiconductor region $1_b$ is included in the HEMT of FIG. 10, which is otherwise identical with its FIG. 1 counterpart. The modified main semiconductor region $1_b$ differs from its FIG. 1 counterpart 1 only in having an additional layer 17, known as a cap layer, on the electron supply layer 9. The cap layer 17 is made from undoped AlGaN or GaN. The source 3 and drain 4 are both formed directly on cap layer 17 in low resistance contact therewith, while the gate 5 is formed on the cap layer 17 in Schottky contact therewith. Alternatively, the source 3 and drain 4 maybe placed in low resistance contact with the electron supply layer 9 and out of contact with the cap layer 17.

The cap layer 17 conventionally functions to enhance the Schottky barrier between main semiconductor region $1_b$ and gate 5. Other advantages of this FIG. 10 embodiment are as previously listed in connection with the FIG. 1 embodiment. The cap layer 17 could be incorporated with the HEMTs of FIGS. 2-9 as well.

Figure 11:
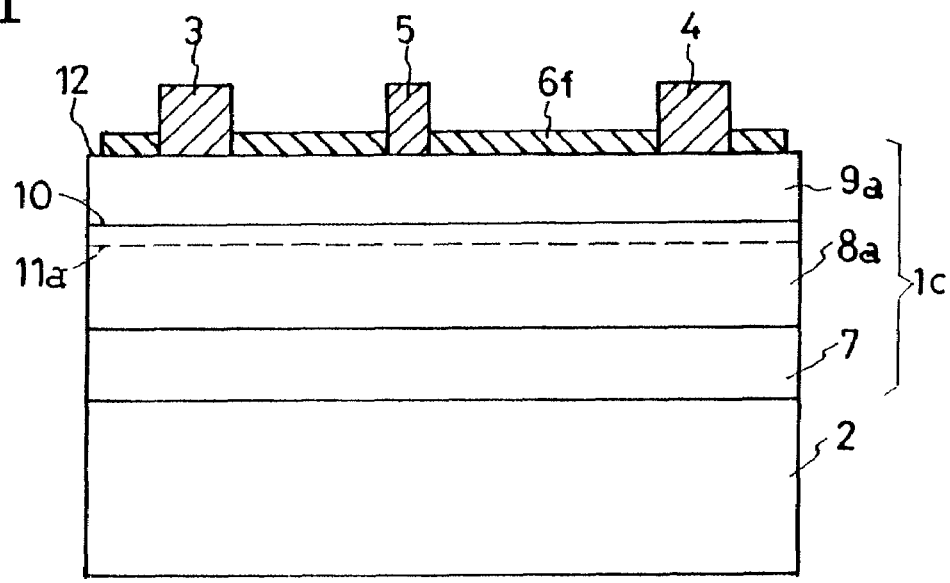
FIG. 11 is also a view similar to FIG. 1 but showing a still further preferred form of HEMT embodying the invention.

Embodiment of FIG. 11

This embodiment features still another modified main semiconductor region $1_c$ and a modified organic semiconductor overlay $6_f$ and is identical with the FIG. 1 embodiment in all the other details of construction. The modified main semiconductor region $1_c$ comprises, in addition to the buffer layer 7, a hole transit layer $8_a$ in place of the electron transit layer 8 of the foregoing embodiments, and a hole supply layer $9_a$ of p-doped semiconductor (e.g., p-AlGaN) in place of the electron supply layer 9 of the foregoing embodiments. A heterojunction exists between hole transit layer $8_a$ and hole supply layer $9_a$, resulting in the creation of a two-dimensional hole gas layer $11_a$ in the hole transit layer $8_a$.

The organic semiconductor overlay $6_f$ of this embodiment is of n type conductivity, instead of p type conductivity as in the organic semiconductor overlays of the foregoing embodiments. The n-type organic semiconductor overlay $6_f$ functions to prevent the diminution of holes in the two-dimensional hole gas layer $11_a$ upon application of a positive voltage to the drain 4.

Preferred materials for the n-type organic semiconductor overlay $6_f$ include fullerene or fullerene-derivative (particularly $C_{60}$ or $C_{70}$), copper-phthalocyanine. Like its p-type counterpart the n-type organic semiconductor overlay $6_f$ may be made by any such known methods as evaporation, sputtering, spin-on, and sol-gel.

Thus, in this embodiment too, current collapse is precluded as the holes are prevented from decreasing in the two-dimensional hole gas layer $11_a$ under the n-type organic semiconductor overlay $6_f$. The HEMT constructions of FIGS. 2-10 also permit replacement of the electron transit layer 8 by a hole transit layer, of the electron supply layer 9 by a hole supply layer, of the two-dimensional electron gas layer 11 by a two-dimensional hole gas layer, and of the p-type organic semiconductor overlay 6 by an n-type organic semiconductor overlay.

Figure 12:
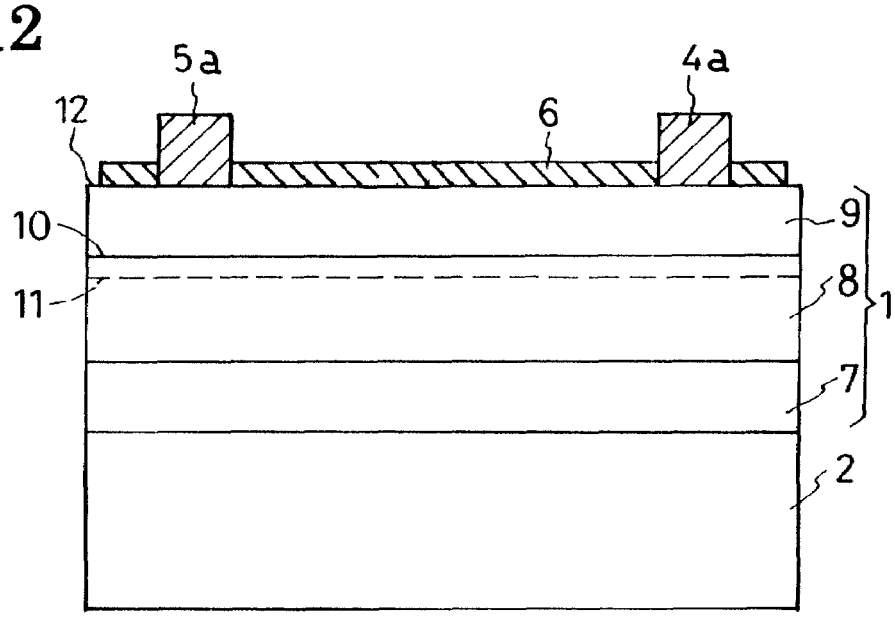
FIG. 12 is also a view similar to FIG. 1 but showing an SBD embodying the invention.

Embodiment of FIG. 12

The invention is here shown applied to an SBD. Structurally, the SBD is equivalent to the HEMT of FIG. 1 except for an ohmic electrode $4_a$ and Schottky electrode $5_a$ on the main semiconductor region 1. These electrodes $4_a$ and $5_a$ are of the same make as their FIG. 1 counterparts 4 and 5, respectively. The organic semiconductor overlay 6 covers all the major surface 12 of the main semiconductor region 1 except where the electrodes $4_a$ and $5_a$ are formed.

In operation, upon application of a forward voltage between the electrodes $4_a$ and $5_a$, a current flows along the path sequentially comprising the Schottky electrode $5_a$, electron supply layer 9, two-dimensional electron gas layer 11, electron supply layer 9, and ohmic electrode $4_a$. The organic semiconductor overlay 6 endows the SBD with the same benefits as those of the HEMT.

Here again the organic semiconductor overlay 6 need not cover the entire major surface 12 of the main semiconductor region 1, but only various parts of it as in the HEMTs of FIGS. 2-6. Additionally, a resistive Schottky-barrier-type field plate similar to that shown at 14 and $14_a$ in FIGS. 7 and 8 may also be provided on the major surface 12 of the main semiconductor region 1. The field plate may then be electrically coupled to either of the electrodes $4_a$ and $5_a$. A further possible modification of this FIG. 12 embodiment is the addition of the cap layer 17, FIG. 10, to the main semiconductor region 1.

Figure 13:
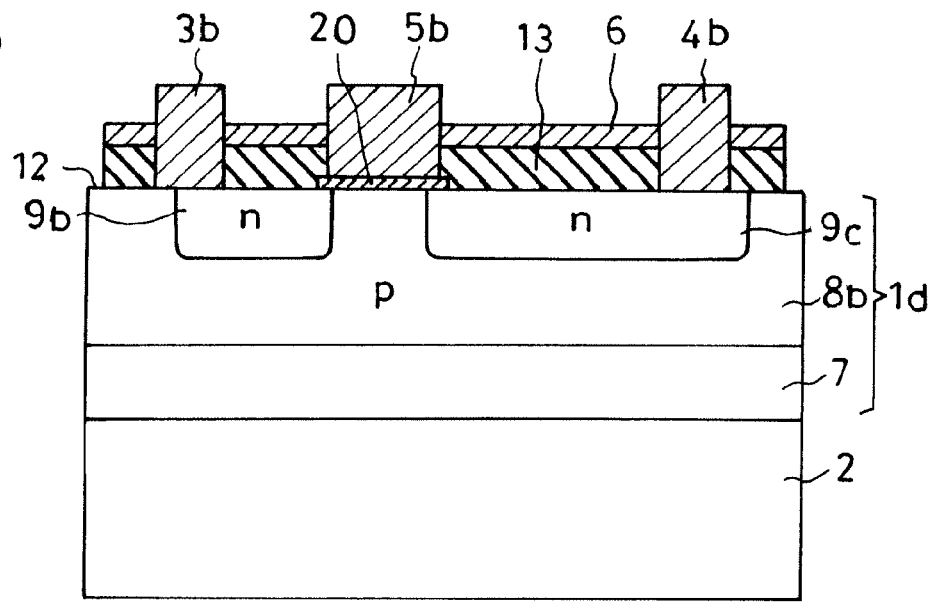
FIG. 13 is also a view similar to FIG. 1 but showing an insulated-gate field-effect transistor embodying the invention.

Embodiment of FIG. 13

The invention is also applicable to an insulated-gate FET (IGFET) as in FIG. 13. The IGFET is similar in construction to the HEMT of FIG. 1 except for a main semiconductor region $1_d$, source electrode $3_b$, drain electrode $4_b$, gate electrode $5_b$, and gate insulator 20.

The modified main semiconductor region $1_d$ comprises the buffer layer 7, a body layer $8_b$ of a p-type semiconductor overlying the buffer layer 7 and providing the major surface 12 of the semiconductor region $1_d$, a source subregion $9_b$ of an n-type semiconductor formed islandlike in the body layer $8_b$ and exposed at the major surface 12, and a drain subregion $9_c$ of an n-type semiconductor also formed islandlike in the body layer $8_b$ and exposed at the major surface 12.

The source electrode $3_b$ on the major surface 12 of the main semiconductor region $1_d$ is positioned contiguous both to the source subregion $9_b$ and, on its side away from the gate electrode $5_b$, to the body layer $8_b$. The drain electrode $4_b$, also on the major surface 12 of the main semiconductor region $1_d$, is positioned contiguous to the drain subregion $9_c$. The gate electrode $5_b$ overlies the gate insulator 20 which covers that part of the surface of the body layer $8_b$ which is exposed between source subregion $9_b$ and drain subregion $9_c$.

The p-type organic semiconductor overlay 6 covers the major surface 12 of the main semiconductor region $1_d$ via the protective covering 13 which was introduced in FIG. 6. Thus, in this IGFET too, the organic semiconductor overlay 6 serves for surface stabilization of the main semiconductor region $1_d$ as in all the preceding embodiments, reducing current leakage between source electrode $3_b$ and drain electrode $4_b$ and so enabling the device to withstand higher voltages.

The organic semiconductor overlay 6 of this IGFET is modifiable to overlie parts of the major surface 12 of the main semiconductor region $1_d$ via the protective covering 13 as in the embodiments of FIGS. 2-6. Another possible modification of this IGFET is the provision of the resistive Schottky barrier field plate 14 or $14_a$, FIGS. 7 and 8, on the surface of the main semiconductor region $1_d$.

Figure 14:
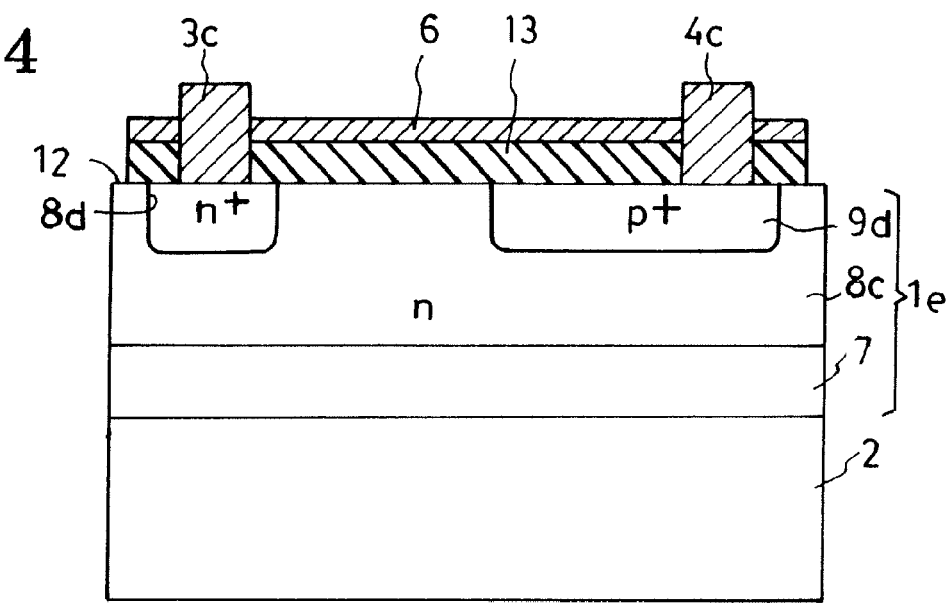
FIG. 14 is also a view similar to FIG. 1 but showing a pn-junction diode embodying the invention.

Embodiment of FIG. 14

This embodiment represents an application of the instant invention to a pn-junction diode. The diode is structurally analogous with the HEMT of FIG. 1 except for a main semiconductor region $1_e$, cathode $3_c$, and anode $4_c$.

The modified main semiconductor region $1_e$ comprises the buffer layer 7, an n-type semiconductor layer $8_c$ overlying the buffer layer 7 and providing the major surface 12 of the main semiconductor region $1_e$, an n$^+$-type semiconductor subregion $8_d$ formed islandlike in the n-type semiconductor layer $8_c$ and exposed at the major surface 12, and a p$^+$-type semiconductor subregion $9_d$ also formed islandlike in the n-type semiconductor layer $8_c$ and exposed at the major surface 12.

The cathode $3_c$ on the major surface 12 of the main semiconductor region $1_e$ is positioned contiguous to the n$^+$-type semiconductor region $8_d$. The anode $4_c$, also on the major surface 12 of the main semiconductor region $1_e$, is positioned contiguous to the p$^+$-type semiconductor region $9_d$.

The p-type organic semiconductor overlay 6 and protective covering 13 are similar in placement to their FIG. 13 counterparts indicated by the same reference numerals. It will be noted that they cover that part of the pn junction between n-type semiconductor layer $8_c$ and p$^+$-type semiconductor subregion $9_d$ which is exposed at the major surface 12 of the main semiconductor region $1_e$. Thus, with the pn junction of this pn-junction diode surface-stabilized by the organic semiconductor overlay 6, the diode is improved in voltage strength through reduction of current leakage between cathode $3_c$ and anode $4_c$.

The organic semiconductor overlay 6 of this pn-junction diode is modifiable to overlie only parts of the major surface 12 of the main semiconductor region $1_d$ via the protective covering 13 as in the embodiments of FIGS. 2-6. Another possible modification of this pn-junction diode is the provision of a resistive Schottky barrier field plate, similar to that shown at 14 in FIG. 7 or at $14_a$ in FIG. 8, on the surface of the main semiconductor region $1_d$.

Possible Modifications

Notwithstanding the foregoing detailed disclosure it is not desired that the present invention be limited by the exact showings of the drawings or the description thereof. The following is a brief list of possible modifications, alterations or adaptations of the illustrated representative semiconductor devices which are all believed to fall within the purview of the claims annexed hereto:

1. The electron supply layer 9 of the FIGS. 1-10 embodiments (HEMTs) need not necessarily be doped into n conductivity type. Piezo depolarization will nevertheless occur owing to the heterojunction between undoped electron supply layer 9 and electron transit layer 8, resulting in the creation of a two-dimensional electron gas layer in the electron transit layer.

2. For the same reason, the hole supply layer 9$_a$ of the other HEMT shown in FIG. 11 could be of an undoped semiconductor. In short the semiconductor regions 8 and 9 of the semiconductor devices according to the invention may be of any materials as long as they are conducive to the creation of the two-dimensional electron gas layer 11 or two-dimensional hole gas layer 11$_a$.

3. Some other semiconductor layer or layers may be added to any of the illustrated main semiconductor regions 1 and 1$_a$-1$_e$. An example is the interposition between electron transit layer 8 and electron supply layer 9 of a thin layer of undoped AlGaN or the like for preventing the diffusion of n-type impurities from electron supply layer 9 into electron transit layer 8.

4. Besides the resistive Schottky barrier field plate 14 of the FIG. 7 embodiment, another such field plate may be provided between source 3 and gate 5.

5. The electron transit layer 8 and electron supply layer 9 of the various disclosed embodiments could be made from Group III-V compound semiconductors other than GaN and AlGaN.

6. The source 3 and drain 4 could be coupled directly to the electron transit layer 8.

7. The substrate 2 could be made from materials other than silicon, such as silicon compounds, sapphire, and Group III-V compound semiconductors.

8. The gate 5 need not be of Schottky barrier type if formed on the main semiconductor region via an insulator.

What is claimed is:

1. A surface-stabilized semiconductor device comprising:
(a) a substrate having a major surface;
(b) a first semiconductor layer formed on the major surface of the substrate by epitaxially growing a first nitride semiconductor;
(c) a second semiconductor layer of n conductivity type formed on the first semiconductor layer by epitaxially growing a second nitride semiconductor thereon for generating two-dimensional electron gas;
(d) a source and a drain disposed on the second semiconductor layer;
(e) a gate disposed between the source and the drain on the second semiconductor layer; and
(f) an organic semiconductor overlay of p conductivity type at least partly covering the second semiconductor layer in a position between the source and the drain, the organic semiconductor overlay having a carrier mobility less than the carrier mobility of the second semiconductor layer.

2. A surface-stabilized semiconductor device as defined in claim 1, further comprising an additional layer of nitride semiconductor disposed between the second semiconductor layer and the organic semiconductor overlay.

3. A surface-stabilized semiconductor device as defined in claim 1, further comprising a protective covering of electrically insulating material covering the second semiconductor layer, the organic semiconductor overlay being formed on the protective covering.

4. A surface-stabilized semiconductor device as defined in claim 1, wherein the gate is a Schottky barrier electrode making Schottky contact with the second semiconductor layer, and wherein the semiconductor device further comprises a resistive Schottky barrier field plate disposed on the second semiconductor and electrically coupled to either of the gate and the drain.

5. A surface-stabilized semiconductor device comprising:
(a) a substrate having a major surface;
(b) a first semiconductor layer formed on the major surface of the substrate by epitaxially growing a first nitride semiconductor;
(c) a second semiconductor layer of p conductivity type formed on the first semiconductor layer by epitaxially growing a second nitride semiconductor thereon for generating two-dimensional hole gas;
(d) a source and a drain disposed on the second semiconductor layer;
(e) a gate disposed between the source and the drain on the second semiconductor layer; and
(f) an organic semiconductor overlay of n conductivity type at least partly covering the second semiconductor layer in a position between the source and the drain, the organic semiconductor overlay having a carrier mobility less than the carrier mobility of the second semiconductor layer.

6. A surface-stabilized semiconductor device as defined in claim 5, wherein the gate is a Schottky barrier electrode making Schottky contact with the second semiconductor layer, and wherein the semiconductor device further comprises a resistive Schottky barrier field plate disposed on the second semiconductor layer and electrically coupled to either of the gate and the drain.

7. A surface-stabilized semiconductor device comprising:
(a) a substrate having a major surface;
(b) a first semiconductor layer formed on the major surface of the substrate by epitaxially growing a first nitride semiconductor;
(c) a second semiconductor layer of the first conductivity type formed on the first semiconductor layer by epitaxially growing a second nitride semiconductor thereon for generating two-dimensional carrier gas;
(d) a first electrode on a major surface of the second semiconductor layer making Schottky contact therewith;
(e) a second electrode on the major surface of the second semiconductor layer making ohmic contact therewith; and
(f) an organic semiconductor overlay of a second conductivity type, opposite to the first conductivity type, at least partly covering the second semiconductor layer in a position between the first and the second electrode for surface stabilization, the organic semiconductor overlay having a carrier mobility less than the carrier mobility of the second semiconductor layer.

* * * * *